United States Patent
Lei et al.

(10) Patent No.: US 9,781,866 B2
(45) Date of Patent: Oct. 3, 2017

(54) VEHICLE POWER MODULE ASSEMBLIES AND MANIFOLDS

(71) Applicant: Ford Global Technologies, LLC, Dearborn, MI (US)

(72) Inventors: Guangyin Lei, Dearborn Heights, MI (US); Tienli Wang, Troy, MI (US); Edward Chan-Jiun Jih, Troy, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 363 days.

(21) Appl. No.: 14/687,342

(22) Filed: Apr. 15, 2015

(65) Prior Publication Data
US 2016/0309623 A1    Oct. 20, 2016

(51) Int. Cl.
| | | |
|---|---|---|
| *H05K 7/20* | (2006.01) | |
| *B60L 11/18* | (2006.01) | |
| *H01L 23/473* | (2006.01) | |
| *H01H 9/52* | (2006.01) | |

(52) U.S. Cl.
CPC ...... *H05K 7/20927* (2013.01); *B60L 11/1851* (2013.01); *H05K 7/20254* (2013.01); *H01H 9/52* (2013.01); *H01L 23/473* (2013.01)

(58) Field of Classification Search
CPC .. H01H 9/52; H05K 7/20927; H05K 7/20272; H01L 23/473; H02K 9/19; B60L 11/1803; B60L 11/1851

USPC .......... 361/699, 702; 165/80.4–80.5, 104.33; 257/714; 174/15.1, 547
See application file for complete search history.

(56) References Cited

U.S. PATENT DOCUMENTS

| | | | |
|---|---|---|---|
| 7,104,312 B2 * | 9/2006 | Goodson | F04B 19/006 165/104.33 |
| 7,188,662 B2 * | 3/2007 | Brewer | H01L 23/473 165/80.4 |
| 7,876,563 B2 | 1/2011 | Shiba | |
| 8,003,245 B2 | 8/2011 | Lee et al. | |
| 8,240,411 B2 * | 8/2012 | Nakatsu | B60L 11/00 180/65.21 |
| 8,488,315 B2 | 7/2013 | Herron et al. | |
| 9,538,691 B2 * | 1/2017 | Kikuchi | H05K 7/2089 |
| 2007/0274045 A1 * | 11/2007 | Campbell | F28C 3/08 361/699 |
| 2013/0309532 A1 | 11/2013 | Chung et al. | |
| 2014/0272496 A1 | 9/2014 | Han et al. | |

(Continued)

*Primary Examiner* — Zachary M Pape
(74) *Attorney, Agent, or Firm* — David B. Kelly; Brooks Kushman P.C.

(57) ABSTRACT

A vehicle power module assembly is provided. The vehicle power module assembly may include a multi-level housing defining first and second chambers, an inlet opening into the first chamber, and an outlet opening from the second chamber. The housing may be configured such that the chambers form a stepped manifold to influence momentum of a coolant flow between the inlet and outlet. A frame may support the housing and is located proximate to at least one power inverter. A screen may be disposed in at least one of the chambers to promote coolant flow uniformity to the outlet. The frame assembly may include a plurality of frames stacked in an array, and each frame may define a channel in at least partial registration with the outlet.

19 Claims, 5 Drawing Sheets

(56) References Cited

U.S. PATENT DOCUMENTS

2016/0309623 A1* 10/2016 Lei .................... H05K 7/20927
2016/0309624 A1* 10/2016 Lei .................... H05K 7/20927

* cited by examiner

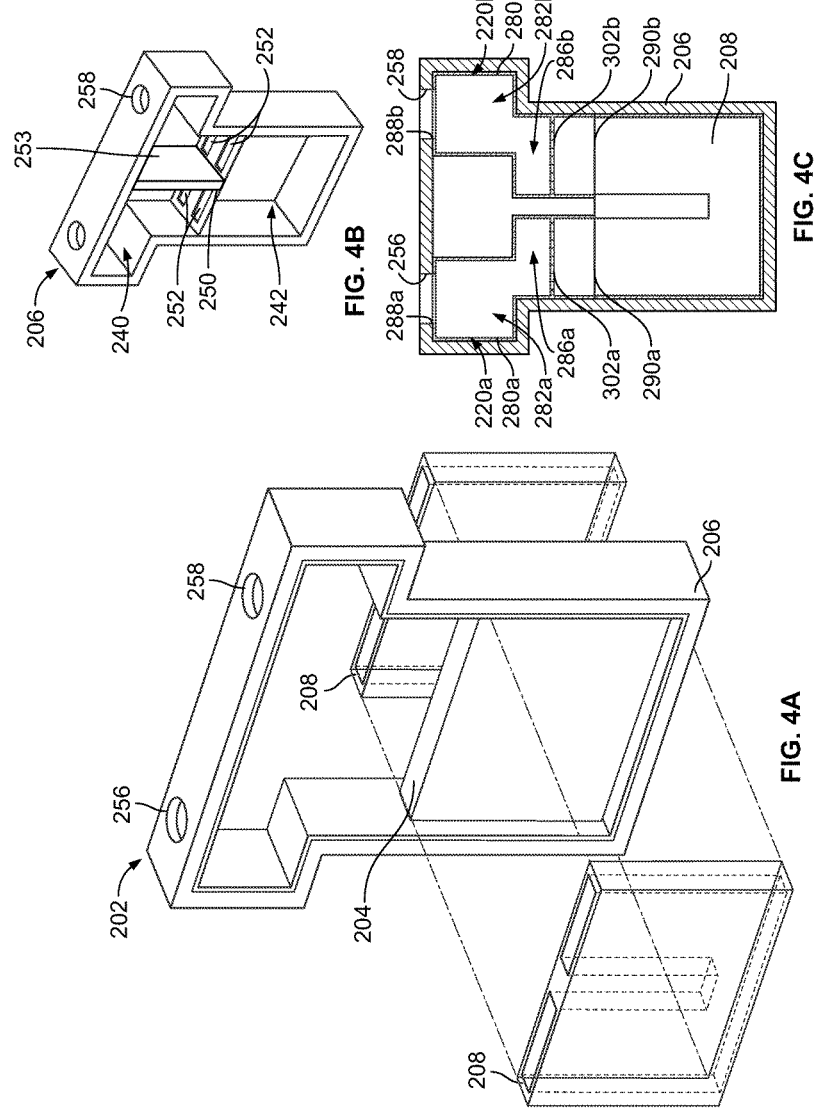

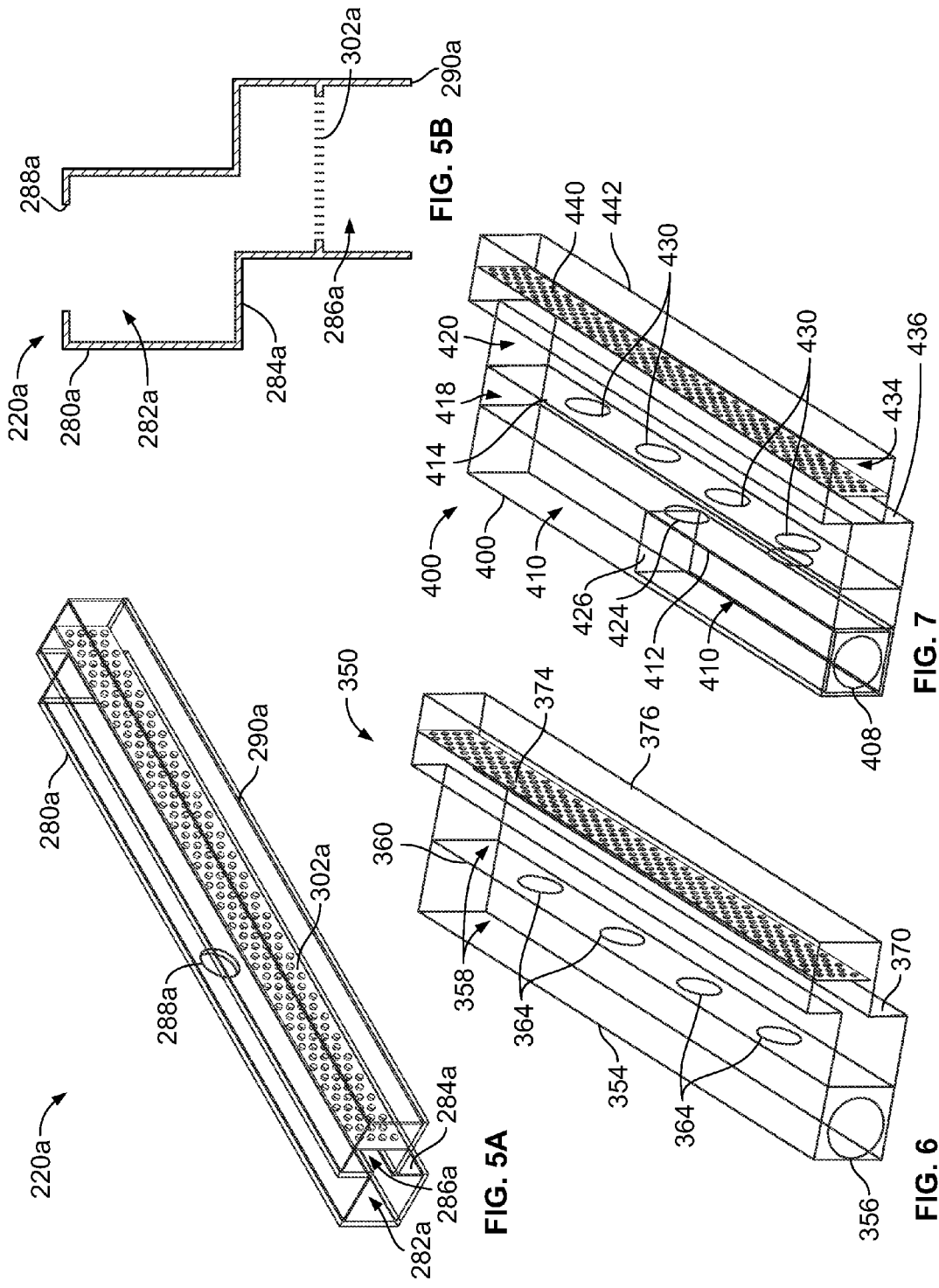

US 9,781,866 B2

VEHICLE POWER MODULE ASSEMBLIES AND MANIFOLDS

TECHNICAL FIELD

The present disclosure relates to power inverters and power module assemblies for automotive vehicles.

BACKGROUND

Electrified vehicles such as battery-electric vehicles (BEVs), plug-in hybrid-electric vehicles (PHEVs), mild hybrid-electric vehicles (MHEVs), or full hybrid-electric vehicles (FHEVs) contain an energy storage device, such as a high voltage (HV) battery. A power inverter can be electrically connected between the battery and any electric machines to convert direct current from the battery to alternating current for the electric machines. The power inverter may also convert alternating current from the electric machines to direct current for the battery.

SUMMARY

A vehicle power module assembly includes a multi-level housing defining first and second chambers, an inlet opening into the first chamber, and an outlet opening from the second chamber. The housing is configured such that the chambers form a stepped manifold to influence momentum of a coolant flow between the inlet and outlet. A frame assembly supports the housing and is located proximate to at least one power inverter. A screen may be disposed in at least one of the chambers to promote coolant flow uniformity to the outlet. Each of the chambers may define a cross-sectional area substantially the same as the other. The chambers may be of a substantially rectangular prism form. The frame assembly may include a plurality of frames stacked in an array, and each frame may define a channel in at least partial registration with the outlet. Each of the frames may further define a cavity sized to at least partially receive one of the at least one power inverters. At least one of the channels may be a multi-pass channel relative to one of the at least one power inverters proximate thereto.

A vehicle power module assembly includes a partitioned housing defining first and second chambers, an inlet opening into the first chamber, an outlet opening from the second chamber, and a first partition partially dividing the first chamber and having at least one pass-through. The housing is configured such that the chambers form a multi-level manifold and the first partition is located upstream of the inlet such that the at least one pass-through promotes uniform coolant flow delivery to the second chamber. The assembly includes a frame assembly to support the housing and at least one power inverter. The first chamber may define a first cross-sectional area greater than a second cross-sectional area defined by the second chamber. The housing may be further configured such that the multi-level manifold defines a ledge to influence a momentum of coolant entering the second chamber. The frame assembly may include a plurality of frames stacked in an array, each frame defining a channel open to the outlet and arranged with the at least one pass-through such that a flow of coolant entering the channels is substantially uniform. The housing may further define a diversion wall adjacent to the at least one pass-through such that coolant flow is directed into the pass-through and not along an entire length of the first chamber. A second partition may be disposed within the first chamber, upstream of the first partition, and define a plurality of ports spaced apart from one another along a length thereof and such that the plurality of ports promote a uniform flow of coolant toward the second chamber. A screen may be disposed within and spanning a length of the second chamber to promote uniform coolant flow to the outlet.

A vehicle includes an electric machine, a traction battery, a power inverter, and a power module assembly. The traction battery is electrically connected to the electric machine. The power inverter is electrically connected between the battery and electric machine. The power module assembly supports the power inverter and includes an inlet and outlet manifold, a power module frame, and a thermal plate. The inlet and outlet manifold each define first and second chambers in fluid communication with, and arranged in a step-orientation relative to, one another. The power module frame defines a power stage cavity. The thermal plate fluidly connects the manifolds and is oriented adjacent the cavity for thermal conductivity with contents thereof. The step-orientation is such that a momentum of coolant entering and exiting the thermal plate is at least partially influenced by first and second ledges defined by the manifolds. The power module assembly may further include a screen disposed within at least one of the second chambers configured to promote uniformity of coolant flow passing therethrough. The power module assembly may further include a power stage disposed within the power stage cavity. The thermal plate may define at least one multi-pass channel. The power module frame may further define a manifold cavity sized to receive the first and second manifolds. The power module assembly may further include at least one partition disposed within one of the chambers of the manifolds defining a plurality of ports spaced apart from one another along a length thereof such that the plurality of ports promote a uniform flow of coolant passing therethrough.

BRIEF DESCRIPTION OF THE DRAWINGS

FIG. 4A is a perspective view of an example of a power module of the portion of the power module assembly of FIG. 3.

FIG. 4B is a perspective view of an example of a frame of the power module of FIG. 4A.

FIG. 4C is a side view, in cross-section, of the power module of FIG. 4A showing an example of a coolant flow path.

FIG. 5A is a perspective view of an example of a manifold of the portion of the power module assembly of FIG. 3.

FIG. 5B is a side view, in cross-section, of the manifold of FIG. 5A.

FIG. 6 is a perspective view of an example of a manifold which may be used with a power module assembly.

FIG. 7 is a perspective view of another example of a manifold which may be used with a power module assembly.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
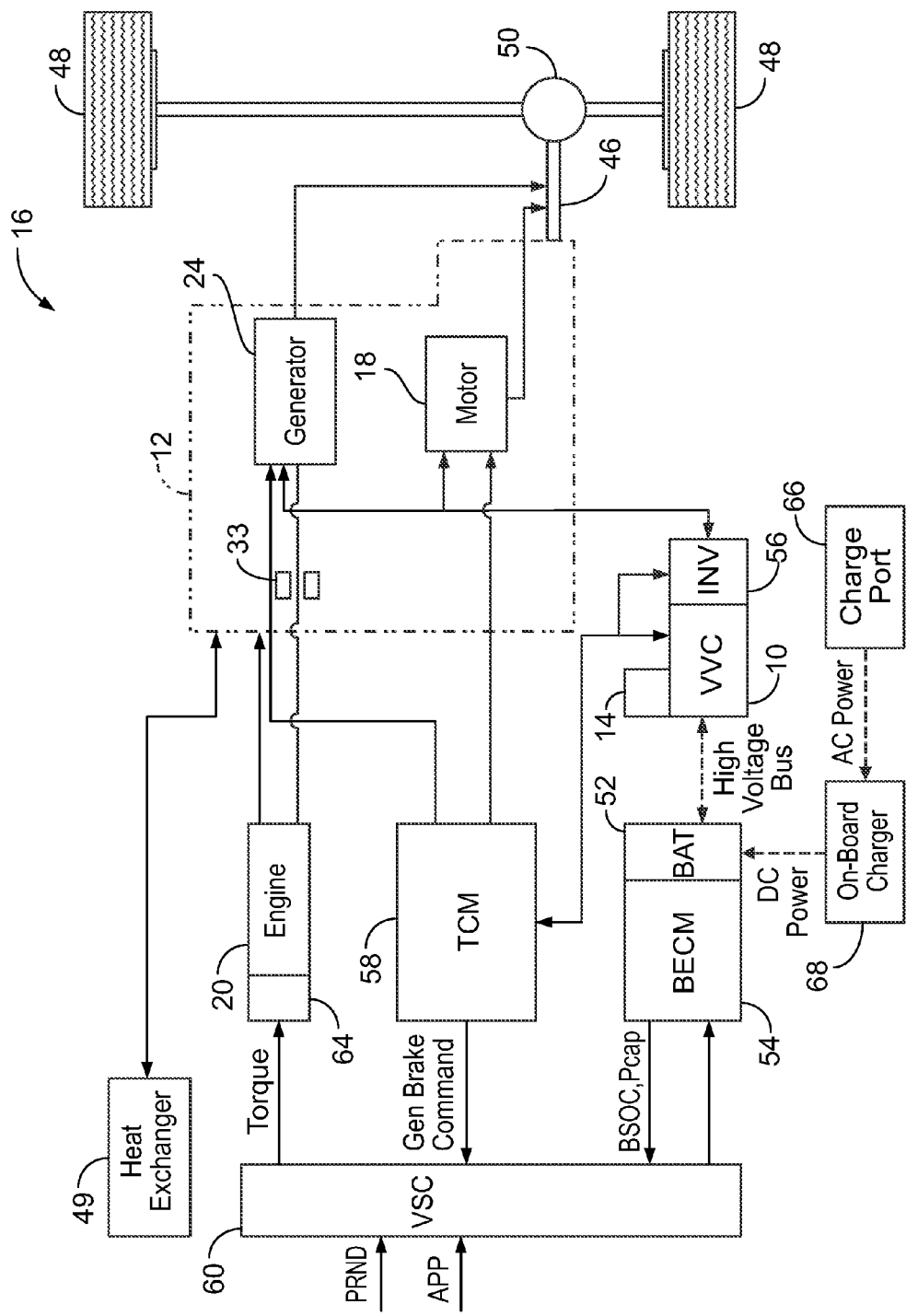
FIG. 1 is a schematic diagram of an example hybrid vehicle.

An example of a PHEV is depicted in FIG. 1, referred to generally as a vehicle 16 herein. The vehicle 16 may include a transmission 12 and is an example of an electric vehicle propelled by an electric machine 18 with assistance from an internal combustion engine 20. The vehicle 16 may be connectable to an external power grid. The electric machine 18 may be an AC electric motor depicted as a motor 18 in FIG. 1. The electric machine 18 receives electrical power and provides torque for vehicle propulsion. The electric machine 18 may also function as a generator for converting mechanical power into electrical power through regenerative braking.

The transmission 12 may be a power-split configuration. The transmission 12 may include the first electric machine 18 and a second electric machine 24. The second electric machine 24 may be an AC electric motor depicted as a generator 24 in FIG. 1. Similar to the first electric machine 18, the second electric machine 24 may receive electrical power and provide output torque. The second electric machine 24 may also operate as a generator for converting mechanical power into electrical power and optimizing power flow through the transmission 12. In other embodiments, the transmission may not have a power-split configuration.

The transmission 12 may include a planetary gear unit (not shown) and may operate as a continuously variable transmission and without any fixed or step ratios. The transmission 12 may also include a one-way clutch (O.W.C.) and a generator brake 33. The O.W.C. may be coupled to an output shaft of the engine 20 to control a direction of rotation of the output shaft. The O.W.C. may prevent the transmission 12 from back-driving the engine 20. The generator brake 33 may be coupled to an output shaft of the second electric machine 24. The generator brake 33 may be activated to "brake" or prevent rotation of the output shaft of the second electric machine 24 and of the sun gear 28. Alternatively, the O.W.C. and the generator brake 33 may be replaced by implementing control strategies for the engine 20 and the second electric machine 24. The transmission 12 may be connected to a driveshaft 46. The driveshaft 46 may be coupled to a pair of drive wheels 48 through a differential 50. An output gear (not shown) of the transmission may assist in transferring torque between the transmission 12 and the drive wheels 48. The transmission 12 may also be in communication with a heat exchanger 49 or an automatic transmission fluid cooler (not shown) for cooling the transmission fluid.

The vehicle 16 includes an energy storage device, such as a traction battery 52 for storing electrical energy. The battery 52 may be a HV battery capable of outputting electrical power to operate the first electric machine 18 and the second electric machine 24 as further described below. The battery 52 may also receive electrical power from the first electric machine 18 and the second electric machine 24 when they are operating as generators. The battery 52 may be a battery pack made up of several battery modules (not shown), where each battery module contains a plurality of battery cells (not shown). Other embodiments of the vehicle 16 contemplate alternative types of energy storage devices, such as capacitors and fuel cells (not shown) that may supplement or replace the battery 52.

A high voltage bus may electrically connect the battery 52 to the first electric machine 18 and to the second electric machine 24. For example, the vehicle 16 may include a battery energy control module (BECM) 54 for controlling the battery 52. The BECM 54 may receive input indicative of certain vehicle conditions and battery conditions, such as battery temperature, voltage, and current. The BECM 54 may calculate and estimate parameters of the battery 52, such as a battery state of charge (BSOC) and a battery power capability (Pcap). The BECM 54 may provide output that is indicative of the BSOC and Pcap to other vehicle systems and controllers.

The vehicle 16 may include a DC-DC converter or variable voltage converter (VVC) 10 and an inverter 56. The VVC 10 and the inverter 56 may be electrically connected between the battery 52 and the first electric machine 18 and the second electric machine 24. The VVC 10 may "boost" or increase a voltage potential of electrical power provided by the battery 52. The VVC 10 may also "buck" or decrease voltage potential of the electrical power provided to the battery 52. The inverter 56 may invert DC power supplied by the battery 52 via the VVC 10 to AC power for operating each of the electric machines 18 and 24. The inverter 56 may also rectify AC power provided by each of the electric machines 18 and 24 to DC for charging the battery 52. In other examples, the transmission 12 may operate with multiple inverters, such as one invertor associated with each of the electric machine 18 and 24. The VVC 10 includes an inductor assembly 14 (further described in relation to FIG. 2).

The transmission 12 is shown in communication with a transmission control module (TCM) 58 for controlling the electric machines 18 and 24, the VVC 10, and the inverter 56. The TCM 58 may be configured to monitor conditions of each of the electric machines 18 and 24 such as position, speed, and power consumption. The TCM 58 may also monitor electrical parameters (e.g., voltage and current) at various locations within the VVC 10 and the inverter 56. The TCM 58 provides output signals corresponding to this information for other vehicle systems to utilize.

The vehicle 16 may include a vehicle system controller (VSC) 60 that communicates with other vehicle systems and controllers for coordinating operations thereof. Although shown as a single controller, it is contemplated that the VSC 60 may include multiple controllers to control multiple vehicle systems and components according to an overall vehicle control logic or software.

The vehicle controllers, such as the VSC 60 and the TCM 58, may include various configurations of microprocessors, ASICs, ICs, memory (e.g., FLASH, ROM, RAM, EPROM and/or EEPROM), and software code to cooperate with one another to perform vehicle operations. The controllers may also include predetermined data, or "look up tables," which are accessible from the memory and may be based on calculations and test data. This predetermined data may be utilized by the controllers to facilitate control of the vehicle operations. The VSC 60 may communicate with other vehicle systems and controllers (e.g., the BECM 54 and the TCM 58) over one or more wired or wireless connections using bus protocols such as CAN and LIN. The VSC 60 may receive input (PRND) that represents a current position of the transmission 12 (e.g., park, reverse, neutral or drive). The VSC 60 may also receive input (APP) that represents an accelerator pedal position. The VSC 60 may provide outputs representative of a desired wheel torque, desired engine speed, and a generator brake command to the TCM 58; and contactor control to the BECM 54.

The vehicle 16 may include an engine control module (ECM) 64 for controlling the engine 20. The VSC 60 provides output, such as desired engine torque, to the ECM 64 that may be based on a number of input signals including APP and may correspond to a driver's request for vehicle propulsion.

The battery 52 may periodically receive AC energy from an external power supply or grid via a charge port 66. The vehicle 16 may also include an on-board charger 68 which receives the AC energy from the charge port 66. The charger 68 may include AC/DC conversion capability to convert the received AC energy into DC energy suitable for charging the battery 52 during a recharge operation. Although illustrated and described in the context of a PHEV, it is contemplated that the inverter 56 may be implemented with other types of electrified vehicles, such as a FHEV or a BEV.

Figure 2:
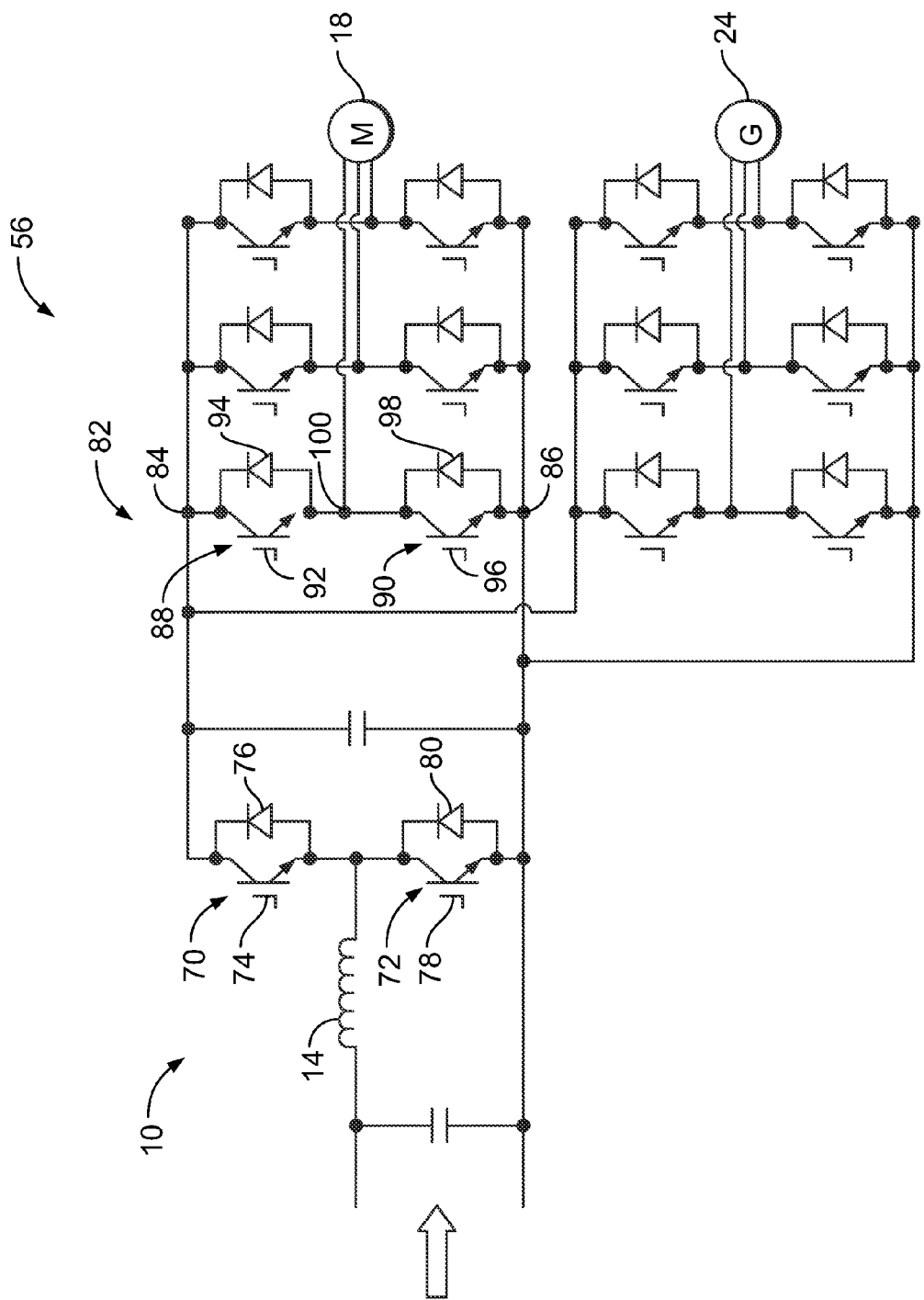
FIG. 2 is a schematic diagram of a variable voltage converter and power inverter.

Referring to FIG. 2, an example of an electrical schematic of the VVC 10 and the inverter 56 is shown. The VVC 10 may include a first switching unit 70 and a second switching unit 72 for boosting the input voltage (V_bat) to provide output voltage (V_dc). The first switching unit 70 is shown with a first transistor 74 connected in parallel to a first diode 76 and with their polarities switched (referred to as anti-parallel herein). The second switching unit 72 is shown with a second transistor 78 connected anti-parallel to a second diode 80. Each of the transistors 74 and 78 may be a type of controllable switch (e.g., an insulated gate bipolar transistor (IGBT) or field-effect transistor (FET)). Additionally, each of the transistors 74 and 78 may be individually controlled by the TCM 58. The inductor assembly 14 is depicted as an input inductor that is connected in series between the battery 52 and the switching units 70 and 72. The inductor assembly 14 may generate magnetic flux when a current is supplied. When the current flowing through the inductor assembly 14 changes, a time-varying magnetic field is created and a voltage is induced. Other embodiments of the VVC 10 may include alternative circuit configurations (e.g., more than two switches).

The inverter 56 may include a plurality of half-bridges 82 stacked in an assembly. Each of the half-bridges 82 may be packaged as a power stage. In the illustrated example, the inverter 56 includes six half-bridges (though FIG. 2 labels only one complete half-bridge 82), three for the motor 18 and three for the generator 24. Each of the half bridges 82 may include a positive DC lead 84 that is coupled to a positive DC node from the battery 52 and a negative DC lead 86 that is coupled to a negative DC node from the battery 52. Each of the half bridges 82 may also include a first switching unit 88 and a second switching unit 90. The first switching unit 88 includes a first transistor 92 connected in parallel to a first diode 94. The second switching unit 90 includes a second transistor 96 connected in parallel to a second diode 98. The first transistor 92 and the second transistors 96 may be IGBTs or FETs. The first switching unit 88 and the second switching unit 90 of each of the half-bridges 82 converts the DC power of the battery 52 into a single phase AC output at the AC lead 100. Each of the AC leads 100 is electrically connected to the motor 18 or generator 24. In this example, three of the AC leads 100 are electrically connected to the motor 18 and the other three AC leads 100 are electrically connected to the generator 24.

Components of VVCs and inverters may be heated and/or cooled using a liquid thermal management system, an air thermal management system, or other method as known in the art. In one example of a liquid thermal management system, a thermal plate may be in thermal communication with the components of the VVC or inverter. A system, such as a pressurized system, may control a flow of coolant through the thermal plates to assist in dissipating heat from the components, such as heat generated during a voltage conversion. The thermal management system may be arranged with and/or supported by a power module assembly such that the thermal plates are in thermal communication with the components to facilitate cooling thereof by the coolant.

Figure 3:
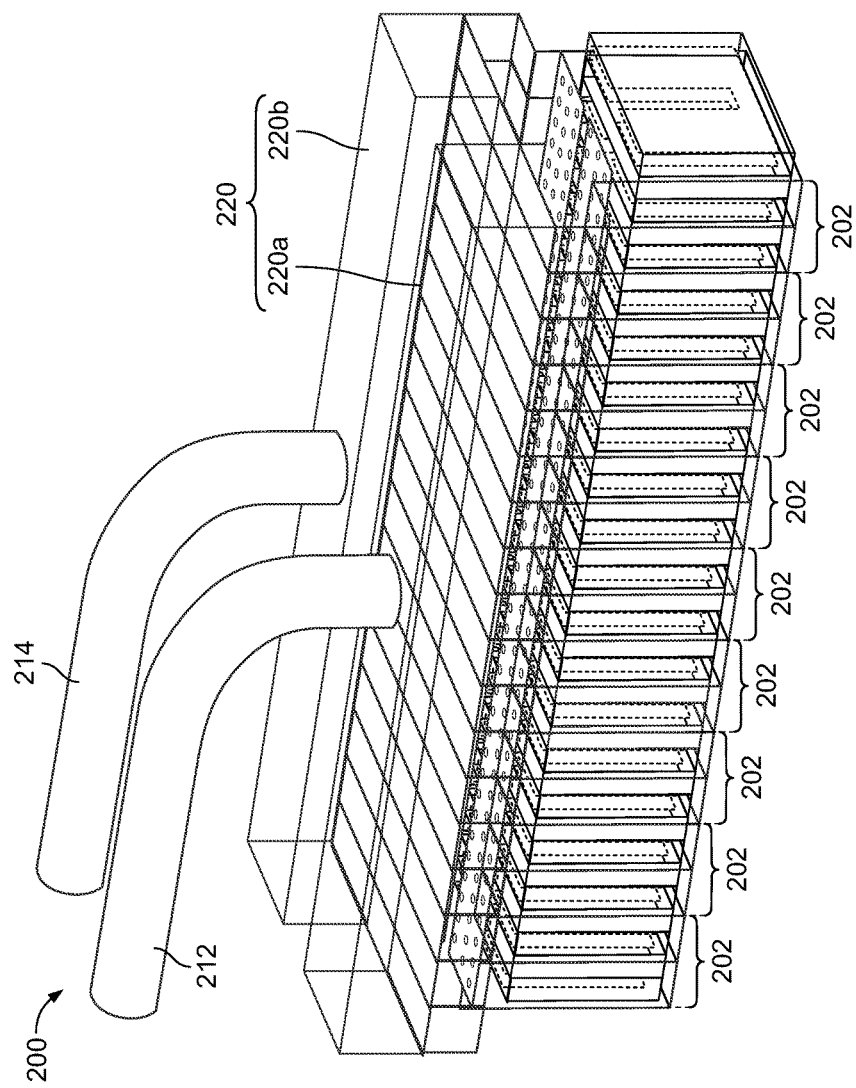
FIG. 3 is a perspective view of an example of a portion of a power module assembly.

FIG. 3 shows an example of a portion of a power module assembly for use with an electrified vehicle, referred to generally as a power module assembly 200 herein. The power module assembly 200 may include a plurality of power modules stacked in an array, each power module referred to generally as a power module 202. Referring additionally to FIGS. 4A through 4C, each power module 202 may include a power stage 204 retained by a frame 206. Each power stage 204 may include semiconductors, a direct current (DC) terminal, and an alternating (AC) terminal. The power stage 204 may be adjacent to one or more thermal plates 208. The thermal plates 208 may be in thermal communication with adjacent power stages 204. The frame 206 may orient the thermal plates 208 in a location proximate to the power stages 204 to provide a flow path for coolant to assist in managing thermal conditions of the power stages 204.

The power module assembly 200 may also include conduits to deliver and remove the coolant. For example, a first conduit 212 and a second conduit 214 may be in fluid communication with a manifold 220 to provide paths for delivering coolant and removing coolant therefrom. The manifold 220 may include a first manifold 220a and a second manifold 220b. The first manifold 220a and the second manifold 220b may assist in managing flow of the coolant entering and exiting the thermals plates 208. For example, the first manifold 220a may be an inlet manifold and the second manifold 220b may be an outlet manifold. The first manifold 220a and the second manifold 220b may be a single component or made of separate components. The manifold 220 may be disposed within and supported by the stacked frames 206.

For example and as shown in FIGS. 4A through 4C, each frame 206 may define one or more cavities, such as a power stage cavity 242 and a manifold cavity 240. A size and shape of each cavity may correspond to a size of a component for disposal therein. Each power stage cavity 242 may be sized to receive one of the power stages 204 and at least a portion of one or more of the thermal plates 208. It is contemplated that the manifold cavity 240 and the power stage cavity 242 may be separated by a divider 250. The divider 250 may have one or more apertures 252 to assist in facilitating a transfer of coolant to and from the respective thermal plate 208. Another divider 253 may be disposed within the manifold cavity 240 and supported by the divider 250. It is also contemplated that the manifold cavity 240 may be open to the thermal plates 208 in a configuration without the divider 250 or the divider 253.

The manifold cavities 240 of the frames 206 may be in substantial registration with one another when the power modules 202 are stacked in an array. The manifold cavities 240 of the frames 206 may be sized to receive a portion of the manifold 220. The manifold 220 may extend substantially along a length of the stacked array of power modules 202 when disposed within the manifold cavities 240. The power stage cavities 242 of the frames 206 may be in substantial registration with one another when the power modules are stacked in an array. Each frame 206 may define surface features, such as slots, within the power stage cavity 242 to assist in orienting and supporting the power stages 204 and the thermal plates 208. The thermal plates 208 may be arranged with the manifold 220 to assist in managing thermal conditions of the power stages 204 and other components of power module assembly 200. At least one of the frames 206 may include a conduit inlet 256 to provide a pass-through for coolant to enter the first manifold 220a from the first conduit 212. At least one of the frames 206 may include a conduit outlet 258 to provide a pass-through for coolant to exit the second manifold 220b into the second conduit 214.

As mentioned above, each thermal plate 208 may be located proximate or adjacent to one or more power stages 204. For example, the thermal plates 208 at opposite ends of the power module assembly 200 may each be adjacent to one of the power stages 204 at the respective ends of the power module assembly 200. The other of the thermal plates 208 of the power module assembly 200 may each be disposed adjacent and between a pair of subsequent power stages 204. Each thermal plate 208 may have, for example, a multi-pass channel configuration to deliver coolant along portions or all of the respective power stage 204. FIG. 4C shows a cross-sectional view of a coolant flow path in which coolant may enter the first manifold 220a enroute to the thermal plate 208 and then to the second manifold 220b. The configuration of the thermal 208 in this example provides for a multi-pass coolant flow relative to the adjacent power stage 204. It is contemplated that alternative multi-pass configurations, for example with three or more multi-passes, are available.

An example of a structure for the first manifold 220a is shown in further detail in FIGS. 5A and 5B. For example, the first manifold 220a may include a housing 280a and the second manifold 220b may include a second housing 280b (further detail of the second manifold 220b is shown in FIGS. 3, 4A and 4C). The housings 280a and 280b each may have a form similar to two rectangular prisms partially overlapping one another and arranged in a step configuration relative to one another. It is contemplated that the housings 280a and 280b may have other forms, such as a form similar to two cylindrical prisms partially overlapping one another and arranged in a step configuration relative to one another.

The housing 280a of the first manifold 220a may define a first chamber 282a, a wall 284a, and a second chamber 286a. The first chamber 282a and the second chamber 286a may define cross-sectional areas substantially equal or equal to one another. The wall 284a may also be referred to as a ledge herein and may influence a momentum of coolant flowing between chambers to assist in redirecting a flow pattern of coolant flowing therethrough. The housing 280 may also define a first port 288a and a second port 290a for liquid, such as coolant, to enter and exit housing 280a. A screen 302a may be disposed within at least one of the first chamber 282a and the second chamber 286a. In this example, the screen 302a is shown as a member with apertures forming a screen within the second chamber 286a. The screen 302a may extend along a length of the first chamber 282a and operate to influence a uniformity of coolant flowing therethrough.

The second housing 280b of the second manifold 220b may define a first chamber 282b, a wall 284b, and a second chamber 286b (best shown in FIGS. 3 and 4C). The first chamber 282b and the second chamber 286b may define cross-sectional areas substantially equal or equal to one another. The wall 284b may also be referred to as a ledge herein and may influence a momentum of coolant flowing between chambers to assist in redirecting a flow pattern of coolant flowing therethrough. The second housing 280b may also define a first port 288b and a second port 290b for fluid, such as coolant, to enter and exit the second housing 280b. A screen 302b may be disposed within at least one of the first chamber 282b and the second chamber 286b. In this example, the screen 302b is shown as a member with apertures forming a screen within the second chamber 286b. The screen 302b may extend along a length of the first chamber 282b and operate to influence a uniformity of coolant flowing therethrough.

It is contemplated that multiple configurations of the first manifold 220a, the second manifold 220b, and the frame 206 are available. While FIGS. 5A and 5B show detail relating to the first manifold 220a, it is to be understood that characteristics and principles shown may be present and/or utilized in the second manifold 220b. For example, in a configuration in which the first manifold 220a is upstream of the second manifold 220b, the first chamber 282a is upstream of the second chamber 286a in the first manifold 220a while the first chamber 282b is downstream of the second chamber 286b in the second manifold 220b. However, it is contemplated that in another configuration the second manifold 220b may be upstream of the first manifold 220a. Each of the configurations may utilize the wall 284a and the wall 284b to assist in managing coolant flow passing therethrough. Further, a pressurized coolant system may provide options to position the first manifold 220a and the second manifold 220b in various orientations such as above, below, or on either side of the power stages 204.

FIG. 6 shows another example of a manifold configuration which may be used with a power module assembly, referred to generally as a manifold 350 herein. The manifold 350 may include a housing 354. The housing 354 may define an inlet 356 opening to a first chamber 358. The first chamber 358 may be divided by a partition 360. The partition 360 may define a plurality of ports 364 spaced apart from one another. The plurality of ports 364 may assist in promoting a uniform or substantially uniform flow of coolant from a first portion to a second portion of the first chamber 358. The housing 354 may further define a second chamber 368. The first chamber 358 and the second chamber 368 may be arranged in a multi-level manifold configuration such that a wall 370 is defined in the path of coolant flow. For example, coolant passing through the plurality of ports 364 may contact the wall 370 prior to entering the second chamber 368. The wall 370 may thus influence a momentum of the coolant to promote a more uniform flow as the coolant enters the second chamber 368. To further influence uniformity of coolant flow, a screen 374 may be disposed within the housing 354 as shown in the second chamber 368 in FIG. 6. The screen 374 may define a plurality of apertures to assist in influencing coolant flow uniformity. The housing 354 may further define an outlet 376 for the coolant. The outlet 376 may open to a thermal plate or other channel which may be proximate to a component, such as a power stage, to assist in managing thermal conditions thereof.

While it is contemplated that multiple configurations are available, the first chamber 358 and the second chamber 368 in this example may have a form similar to that of rectangular prisms which may at least partially overlap one another. In an alternative configuration, the housing 354 may have a form similar to, for example, two cylindrical prisms partially overlapping one another and arranged in a step configuration relative to one another.

The manifold 350 thus provides a multi-level manifold having features to assist in influencing a momentum and uniformity of coolant flow to increase an efficiency of thermal condition management of adjacent components, such as power stages. Additional features of the manifold 350 may be modified depending on available packaging space and desired performance. For example, a cross-sectional area of the first chamber 358 may be greater than a cross-sectional area of the second chamber 368. A variance in the cross-sectional areas may provide additional space to include one or more partitions.

FIG. 7 shows another example of a manifold configuration which includes multiple partitions, referred to generally as a manifold 400 herein. In this example, the manifold 400 may include a housing 404. The manifold 400 may be an inlet manifold paired with an opposing outlet manifold (not shown) having similar characteristics. The housing 404 may define an inlet 408 opening to a first chamber 410 defined by the housing 404 and a first partition 412. The first partition 412, a second partition 414, and the housing 404 may define a second chamber 418 and a third chamber 420. A first partition port 424 may be defined by the first partition 412. A diversion wall 426 may divide the first chamber 410 and be located adjacent to the first partition port 424. The diversion wall 426 may operate to direct coolant flow into the first partition port 424 and no along an entire length of the first chamber 410. A plurality of second partition ports 430 may be spaced apart from one another and defined by the second partition 414 to promote a uniform flow of coolant into the third chamber 420.

The housing 404 may define a fourth chamber 434 offset from the first chamber 410, the second chamber 418, and the third chamber 420. For example, an orientation of the chambers may be such that the manifold 400 is multi-leveled and/or stepped and may be such that a ledge 436 is defined to influence coolant flow. For example, coolant passing through the plurality of ports 364 enroute to the fourth chamber 434 may contact the ledge 436 prior to entering the fourth chamber 434. The wall 370 may thus influence a momentum of the coolant to promote a more uniform flow as the coolant enters the fourth chamber 434. To further influence uniformity of coolant flow, a screen 440 may be disposed within the housing 354 as shown in the fourth chamber 434 in FIG. 7. The screen 440 may define a plurality of apertures to assist in influencing coolant flow uniformity. The housing 404 may further define an outlet 442 for the coolant. The outlet 442 may open to a thermal plate or other channel which may be proximate to a component, such as a power stage, to assist in managing thermal conditions thereof. The manifold 400 thus provides a multi-level manifold having features to assist in influencing a momentum and uniformity of coolant flow to increase an efficiency of thermal condition management of adjacent components, such as power stages.

While it is contemplated that multiple configurations are available, a first manifold level including the first chamber 410, the second chamber 418, and the third chamber 420 may collectively have a form similar to that of a rectangular prism. Similarly, a second manifold level may include the fourth chamber 434 and may a form similar to that of a rectangular prism. The fourth chamber 434 may at least partially overlap one another. In an alternative configuration, the chambers may collectively have a form similar to, for example, two cylindrical prisms partially overlapping one another and arranged in a step configuration relative to one another. Additional features of the manifold 400 may be modified depending on available packaging space and desired performance. For example, a cross-sectional area of the chambers of the first manifold level may be greater than a cross-sectional area of the fourth chamber 434. A variance in the cross-sectional areas may provide additional space to include one or more partitions.

It is contemplated that the frame 206 described above may have alternative configurations to accommodate alternative manifold configurations, such as the manifolds 350 and 400.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power module assembly comprising:
    a multi-level housing defining first and second chambers arranged with one another to form a stepped manifold for influencing coolant flow, an inlet opening into the first chamber, and an outlet opening from the second chamber; and
    a stacked array of frames to support the housing, each frame defining a channel in at least partial registration with the outlet opening, and located proximate to at least one power inverter.

2. The assembly of claim 1, further comprising a screen disposed in at least one of the chambers to promote coolant flow uniformity to the outlet.

3. The assembly of claim 1, wherein each of the chambers defines a cross-sectional area substantially the same as the other.

4. The assembly of claim 1, wherein the chambers are of a substantially rectangular prism form.

5. The assembly of claim 1, wherein each of the frames further defines a cavity sized to at least partially receive one of the at least one power inverters.

6. The assembly of claim 5, wherein at least one of the channels is a multi-pass channel relative to one of the at least one power inverters proximate thereto.

7. A vehicle power module assembly comprising:
    a partitioned housing defining first and second chambers, an inlet opening into the first chamber, an outlet opening from the second chamber, and a first partition partially dividing the first chamber and having at least one pass-through, wherein the housing is configured such that the chambers form a multi-level manifold and the first partition is located upstream of the inlet such that the at least one pass-through promotes uniform coolant flow delivery to the second chamber;

a frame assembly to support the housing; and at least one power inverter supported by the frame assembly such that the housing is located proximate the inverter.

8. The assembly of claim 7, wherein the first chamber defines a first cross-sectional area greater than a second cross-sectional area defined by the second chamber.

9. The assembly of claim 7, wherein the housing is further configured such that the multi-level manifold defines a ledge to influence a momentum of coolant entering the second chamber.

10. The assembly of claim 7, wherein the frame assembly comprises a plurality of frames stacked in an array, each frame defining a channel open to the outlet and arranged with the at least one pass-through such that a flow of coolant entering the channels is substantially uniform.

11. The assembly of claim 7, wherein the housing further defines a diversion wall adjacent to the at least one pass through such that coolant flow is directed into the pass-through and not along an entire length of the first chamber.

12. The assembly of claim 7, further comprising a second partition disposed within the first chamber, upstream of the first partition, and defining a plurality of ports spaced apart from one another along a length thereof and such that the plurality of ports promote a uniform flow of coolant toward the second chamber.

13. The assembly of claim 7, further comprising a screen disposed within and spanning a length of the second chamber to promote uniform coolant flow to the outlet.

14. A vehicle comprising:

an electric machine;

a traction battery electrically connected to the electric machine;

a power inverter electrically connected between the battery and electric machine; and a power module assembly supporting the power inverter and comprising an inlet and an outlet manifold each defining first and second chambers in fluid communication with, and arranged in a step-orientation relative to, one another;

a power module frame defining a power stage cavity; and a thermal plate fluidly connecting the manifolds and oriented adjacent the cavity for thermal conductivity with contents thereof, wherein the step-orientation is such that a momentum of coolant entering and exiting the thermal plate is at least partially influenced by first and second ledges defined by the manifolds.

15. The vehicle of claim 14, wherein the power module assembly further comprises a screen disposed within at least one of the second chambers configured to promote uniformity of coolant flow passing therethrough.

16. The vehicle of claim 14, wherein the power module assembly further comprises a power stage disposed within the power stage cavity.

17. The vehicle of claim 14, wherein the thermal plate defines at least one multi-pass channel.

18. The vehicle of claim 14, wherein the power module frame further defines a manifold cavity sized to receive the first and second manifolds.

19. The vehicle of claim 14, wherein the power module assembly further comprises at least one partition disposed within one of the chambers of the manifolds defining a plurality of ports spaced apart from one another along a length thereof such that the plurality of ports promote a uniform flow of coolant passing therethrough.

* * * * *